United States Patent
Aragonés Ortiz et al.

(10) Patent No.: US 10,601,223 B2
(45) Date of Patent: Mar. 24, 2020

(54) THERMOELECTRIC POWER GENERATING SYSTEM

(71) Applicants: Universitat Autonoma de Barcelona, Bellaterra (ES); Raúl Aragonés Ortiz, Bellaterra (ES); Roger Malet Munté, Bellaterra (ES); Alternative Energy Innovations, S.L., Barcelona (ES)

(72) Inventors: Raúl Aragonés Ortiz, Bellaterra (ES); Roger Malet Munté, Bellaterra (ES); Carles Ferrer Ramis, Bellaterra (ES); Joan Oliver Malagelada, Bellaterra (ES)

(73) Assignees: Universitat Autonoma de Barcelona, Bellaterra (ES); Alternative Energy Innovations, S.L., Barcelona (ES)

( * ) Notice: Subject to any disclaimer, the term of this patent is extended or adjusted under 35 U.S.C. 154(b) by 22 days.

(21) Appl. No.: 15/570,228

(22) PCT Filed: Apr. 26, 2016

(86) PCT No.: PCT/EP2016/059223
§ 371 (c)(1),
(2) Date: Oct. 27, 2017

(87) PCT Pub. No.: WO2016/174002
PCT Pub. Date: Nov. 3, 2016

(65) Prior Publication Data
US 2018/0138701 A1    May 17, 2018

(30) Foreign Application Priority Data
Apr. 28, 2015  (EP) .................................. 15165327

(51) Int. Cl.
*G05F 1/66*    (2006.01)
*H02J 3/14*    (2006.01)
(Continued)

(52) U.S. Cl.
CPC ............... *H02J 1/102* (2013.01); *G05F 1/66* (2013.01); *H01L 35/325* (2013.01); *H02M 1/14* (2013.01);
(Continued)

(58) Field of Classification Search
CPC .......... H02J 1/102; H02S 10/30; H02S 40/32
(Continued)

(56) References Cited

U.S. PATENT DOCUMENTS 6,275,958 B1 *  8/2001  Carpenter .............. G01R 31/40
                                              307/82
9,197,143 B1 * 11/2015  Townsend ............... H02J 1/108
(Continued)

FOREIGN PATENT DOCUMENTS

EP    0878851    11/1998
EP    1519473    3/2005

OTHER PUBLICATIONS

International Search Report corresponding to International Application No. PCT/EP2016/059223 dated 7 Jul. 14, 2016.

*Primary Examiner* — Michael Rutland Fin
(74) *Attorney, Agent, or Firm* — Jenkins, Wilson, Taylor & Hunt, P.A.

(57) ABSTRACT

The presently disclosed subject matter provides thermoelectric power generating systems that can include an arrangement of power generator units electrically connected to provide a global output voltage, each power generator unit generating an individual output voltage, and an electronic stabilization system. The electronic stabilization system can include DC/DC converters connected to one or more of the power generator units; electrical variable detectors including at least one of voltage detectors and current detectors for automatically measuring the individual voltage or individual current existing at a point of a DC/DC converter; and a
(Continued)

microprocessor-based controller connected to the voltage and/or current detectors to receive the measured voltages and/or currents, and, based on the measurements, to control the operation of the DC/DC converters to obtain desired DC/DC converter output voltages and/or desired DC/DC converter currents.

10 Claims, 7 Drawing Sheets

(51) Int. Cl.
    *H02J 1/10*     (2006.01)
    *H02M 3/158*     (2006.01)
    *H02M 1/14*     (2006.01)
    *H02S 10/30*     (2014.01)
    *H01L 35/32*     (2006.01)
    *H02M 3/156*     (2006.01)
    *H01L 35/00*     (2006.01)
    *H02S 40/32*     (2014.01)

(52) U.S. Cl.
    CPC ........... *H02M 1/143* (2013.01); *H02M 3/156* (2013.01); *H02M 3/1584* (2013.01); *H02S 10/30* (2014.12); *H01L 35/00* (2013.01); *H02S 40/32* (2014.12)

(58) Field of Classification Search
    USPC ..................................... 307/52, 82
    See application file for complete search history.

(56) References Cited

U.S. PATENT DOCUMENTS

| | | | |
|---|---|---|---|
| 2004/0070893 A1* | 4/2004 | Ahn | H01F 17/0033 361/38 |
| 2005/0052163 A1* | 3/2005 | Sutardja | H02M 3/157 323/222 |
| 2012/0068543 A1 | 3/2012 | Caraglio et al. | |
| 2012/0306278 A1* | 12/2012 | Fajtl | H02M 3/156 307/82 |

\* cited by examiner

THERMOELECTRIC POWER GENERATING SYSTEM

CROSS-REFERENCE TO RELATED APPLICATIONS

This application is a United State National Stage entry under 35 USC § 371(b) of PCT International Application Serial No. PCT/EP2016/059223, filed Apr. 26, 2016, and claims the benefit of European Patent Application Serial No. 15165327.6, filed on Apr. 28, 2015, each of which is incorporated by reference herein in its entirety.

FIELD OF THE ART

The present invention relates to a thermoelectric power generating system, comprising a power generator arrangement with several thermoelectric power generator units and electronic stabilization means including several DC/DC converters connected to the output of the thermoelectric power generator units and a microprocessor-based controller for controlling the operation of the DC/DC converters to obtain desired output voltages and/or output currents.

PRIOR STATE OF THE ART

At present, there are many thermoelectric power generating systems also known as energy recovery systems. In some countries, however, and due to environmental conditions, these systems can act as generators or as receivers of this energy, depending on the thermoelectric devices they include and particularly on the arrangements thereof.

As examples of said systems are those based on the next thermoelectric cells:

Solar cells, which when are under shadow become a resistive load lowering the overall efficiency of the system.

Peltier cells, which can work as generators when submitted to a thermal gradient (Seebeck effect), or absorb energy to generate a temperature differential between their two faces (Peltier effect). This effect has two problems: the power consumption and the possible heating of the cold cell side and cooling of hot side cell.

Since in both cases the cells may act as both power generators and power consumers, in a system composed of multiple cells power generators and power consumers can coexist, undesirably. In the latter case, cells that may act as power consumers may absorb some or all of the energy generated.

The fact that each thermoelectric cell (or group of cells) can give a different current or voltage depending on the surrounding conditions, particularly on thermal gradient b. T, makes that, in order to allow adding the electrical potential provided by each thermoelectric cell, serial and/or parallel arrangements thereof must be made.

However, these thermoelectric cells will generate different voltages depending on the thermal gradient b. T under which they are submitted, which causes that sometimes the most suitable connectivity arrangement will be the serial arrangement, other times the parallel arrangement and other times it will be better to electrically isolate the cells.

In order to partially overcome said drawbacks, there are proposals that for achieving unifying the global output voltage of a system formed by an arrangement of thermoelectric cells, associate cells operating at different potentials according to serial and/or parallel arrangements, in order to improve its efficiency.

One of said proposals is disclosed by EP0878851, which discloses a thermoelectric power generator system including the features of the preamble of claim 1 of the present invention, i.e.:

a power generator arrangement comprising power generator units electrically connected to each other to provide a global output voltage, each power generator unit including at least one thermoelectric device and being capable of generating an individual output voltage;

electrical variable detection means for measuring an output electrical variable of the power generator units; and a microprocessor-based controller connected to said electrical variable detection means to receive the measured electrical variable and configured for controlling the operation of the power generator arrangement based on the received measured electrical variable.

In the system of EP0878851, the electrical variable detection means are voltage detection means for measuring an output voltage of the power generator units when they are connected in parallel. The control of the operation of the power generator arrangement performed by the system of EP0878851 consists only in reconfiguring the electrical connection arrangement of the power units, in the form of a serial connection, a parallel connection or a combination of serial and parallel connection.

The proposal disclosed in EP0878851 is clearly improvable, as it doesn't overcome completely the above mentioned drawbacks for all possible scenarios, i.e. the fact that some thermoelectric cells can undesirably act as consumers of the power generated by neighbouring cells. Moreover, it needs of the inclusion of switch arrangements and associated switching circuitry in the system, and thus cannot be applied to an already existing non-reconfigurable thermoelectric power generating system.

DESCRIPTION OF THE INVENTION

It is necessary to offer an alternative to the state of the art which covers the gaps found therein, by providing a thermoelectric power generating system which allows connecting a plurality of thermoelectric devices, adding the electrical power generated by each of them independently on the environmental surrounding conditions where they are placed, i.e. independently of the thermal gradients to which they are submitted, assuring that each thermoelectric device acts always as a power generator, i.e. never as a power consumer.

To that end, the present invention relates to a thermoelectric power generating system, comprising:

a power generator arrangement comprising power generator units electrically connected to each other to provide a global output voltage, each power generator unit including at least one thermoelectric device and being capable of generating an individual output voltage;

electrical variable detection means for measuring an output electrical variable of the power generator units; and a microprocessor-based controller connected to said electrical variable detection means to receive the measured electrical variable and configured for controlling the operation of the power generator arrangement based on the received measured electrical variable.

In contrast to the systems known in the art, the system of the present invention comprises, in a characteristic manner, electronic stabilization means comprising:

several DC/DC converters, each with an input connected to the individual output voltage of at least one of said power generator units;

said electrical variable detection means, which comprise several voltage and/or current detectors, each for automatically measuring the individual voltage or current existing at a point of the DC/DC converter connected to at least one of the power generator unit; and said microprocessor-based controller, which is connected to said voltage and/or current detectors to receive the measured voltages and/or currents, and is configured for automatically controlling the operation of the DC/DC converters, based on the measured voltages and/or currents, to obtain desired DC/DC converter output voltages and/or desired DC/DC converter output currents.

The system of the present invention is not based in modifying the association of the thermoelectric devices, i.e. their connectivity arrangement. In contrast, the system of the present invention seeks that the thermoelectric devices or set of them work separately adjusting the output voltages/currents thereof, to associate in the output of the system the particular electrical potential provided by each thermoelectric device or set of thermoelectric devices. The electronic stabilization means are in charge of adding together said particular electrical potentials.

For a preferred embodiment, the microprocessor-based controller is implemented in a System on Chip (SoC), although other kinds of implementations are also embraced by the present invention, such as a System in Package (SiC).

In general, the DC/DC converters are modulation controlled converters, the microprocessor-based controller being configured for controlling the operation of the DC/DC converters by controlling the modulation thereof, where said modulation is preferably a PWM modulation.

According to an embodiment, each of the several voltage and/or current detectors is connected to a middle point of each of the DC/DC converters for measuring the voltage existing at said middle point and/or the current circulating there through.

The microprocessor-based controller of the system of the present invention implements at least one control algorithm for analysing in real time the values of the received measured voltages and/or currents and for automatically controlling the operation of the DC/DC converters, based on the results of said real time analysis, with the goal of equalizing the output voltages of all the DC/DC converters, said desired DC/DC converter output voltages being equal voltages.

According to a preferred embodiment, each of the DC/DC converters comprises, at its output, a series output inductor each having an input terminal and an output terminal, where the output terminals of the series output inductors are electrically connected together, such that the currents circulating there through are added, and also to a first terminal of a common parallel output capacitor at which terminals the global output voltage is provided, where the values of the series output inductors and of the common parallel output capacitor are selected to stabilize the global output voltage at least minimizing the voltage ripple thereof.

For a preferred embodiment, each of the several voltage detectors is connected to the first terminal of a respective of said series output inductors, for measuring the voltage existing at said first terminal including the voltage ripple contained therein. In this case, the above mentioned middle point corresponds to a point between a diode and a series output converter, for each DC/DC converter. The selection of such a middle point is very important, as the voltage existing at that middle point has two components: the average voltage and the voltage ripple, the latter being used for the system of the present invention for the control of each channel (i.e. of each DC/DC converter).

For a preferred embodiment, the control algorithm is configured to automatically control the operation of the DC/DC converters based on said measured voltage ripples, to adjust the global output voltage to a required value by equalizing the contribution of the DC/DC converters to said global output voltage, increasing the contribution of the DC/DC converter or converters with a lower voltage ripple and/or decreasing the contribution of the DC/DC converter or converters with a higher voltage ripple.

The advantage of analysing the ripple is that with a single measure it can be obtained the output voltage (average) and the contribution of each output channel to the whole system. Then, the contribution of each channel is equalized using a PWM control on an ADC. This operation saves ADCs compared to others proposals, with the power savings that this supposes.

Said control algorithm performs said increasing/decreasing of the DC/DC converter contribution to the global output voltage, preferably, by generating respective individual duty cycle PWM values for the PWM-modulation control of the DC/DC converters.

According to an embodiment, each DC/DC converter is connected, at its input, to the output of one of the power generator units.

Alternatively, the power generator units are grouped in groups according to different thermal gradient ranges under which the power generator units are submitted, and the input or inputs of each DC/DC converter is/are connected to the outputs of a respective one of said groups of power generator units.

Preferably, the thermoelectric devices of the power generator units are or comprise one or more Peltier cells, generally arranged in the power generator arrangement such that when submitted to thermal gradients differing from each other above a determined threshold, some of them tend to generate undesired individual output voltages which can reverse the operation mode of some others of the Peltier cells, thus making the latter work to electro-thermally generate thermal energy, wherein the electronic stabilization means are adapted to avoid said reversal of the operation mode of the Peltier cells, for which purpose the microprocessor-based controller is configured for automatically controlling the operation of the DC/DC converters to obtain desired individual output voltages having a value higher than said undesired individual output voltages.

For an embodiment, the values of said undesired individual output voltages are stored in a memory, external or internal to the microprocessor-based controller, so that the latter retrieves said values from said memory in order to perform the control of the DC/DC converters such that none of them never generates an individual output voltage which is not higher than the undesired individual voltage for the corresponding converter.

Said undesired output voltages can be equal or different for each DC/DC converter, depending on the embodiment, and can also have fixed values or values which vary based on different circumstances, such as environmental conditions (temperature, humidity, etc.), date, time, reconfiguration of the electrical connection arrangement, breakdown of misoperation of some of the DC/DC converters, etc., the microprocessor-based controller being, preferably, adapted to update the stored undesired individual output voltages values when they vary, as indicated above, and even to calculate said values based on sensor measurements and/or numeric models of the power generator arrangement and/or other input data.

For another embodiment, the thermoelectric devices of the power generator units are or comprise one or more solar cells, the electronic stabilization means avoiding the solar cells under shadow becoming resistive loads.

BRIEF DESCRIPTION OF THE DRAWINGS

The previous and other advantages and features will be more fully understood from the following detailed description of embodiments, with reference to the attached drawings, which must be considered in an illustrative and non-limiting manner, in which.

DETAILED DESCRIPTION OF SEVERAL EMBODIMENTS

Figure 1:
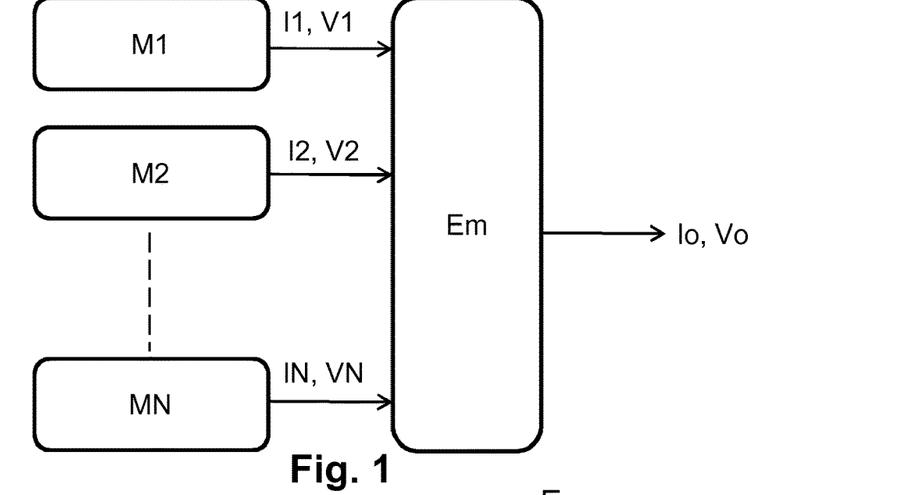
FIG. 1 is a block diagram of the system of the present invention, for an embodiment.

FIG. 1 is a block diagram of the system of the present invention, for an embodiment, where the outputs of the power units M1 . . . MN, or transducer modules, are connected to respective inputs of the electronic stabilization means Em, providing the latter with respective current and voltage signals 11, V1 . . . 1N, VN, which are stabilized by the electronic stabilization means Em, in the form of signals lo, Vo.

For the embodiment of FIG. 1, each transducer module M1 . . . MN consists of one or more Peltier cells operating at the same temperature and at the same thermal differential. Therefore, each transducer module M1 . . . MN provides at its output a certain voltage V1 . . . VN and a certain current 11 . . . 1N.

The electronic stabilization means Em contains a set of DC/DC converters and corresponding control electronics which, from the individual voltages delivered by the DC/DC converters, equalizes the voltage of each transducer module M1 . . . MN to a specific output voltage. By addition of output currents to the output voltage Vo set by the control electronics, the power delivered by the global system is obtained.

Thanks to the control electronics, if one of the transducer modules M1 . . . MN is not supplying power, it won't either consume power generated by the other transducer modules M1 . . . MN.

Figure 2:
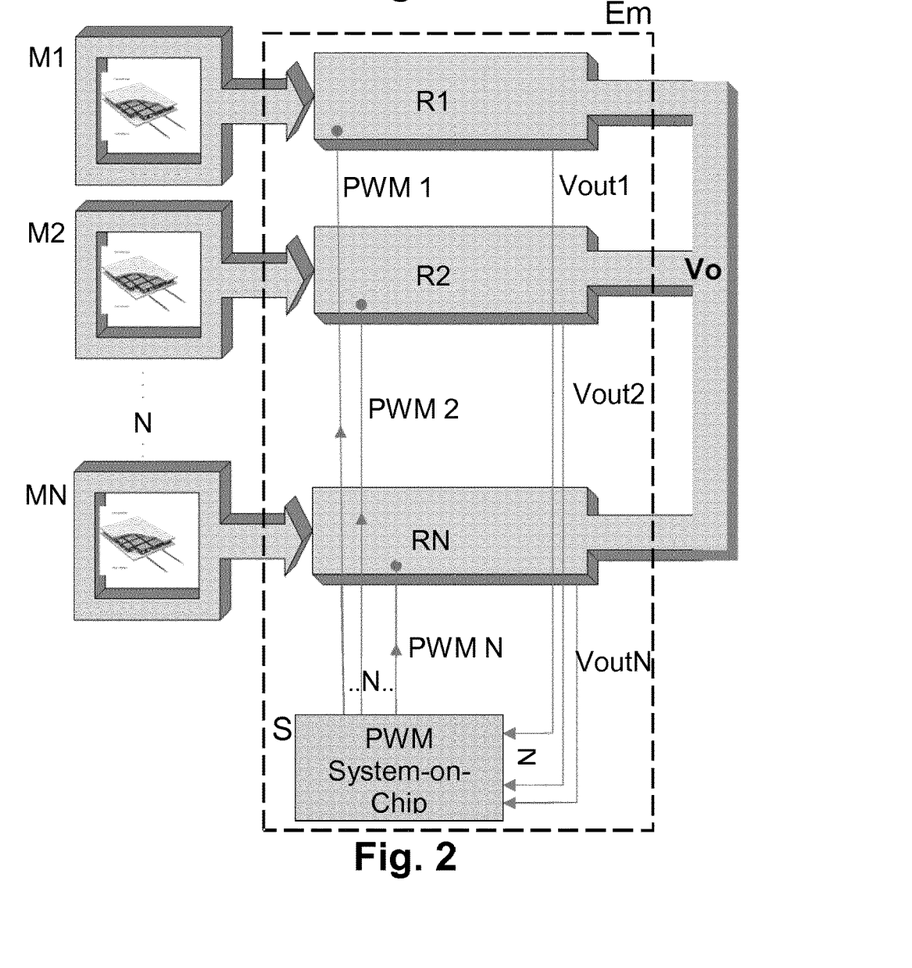
FIG. 2 schematically shows the system of the present invention, for an embodiment, depicting the internal elements of the electronic stabilization means.

As shown in FIG. 2, the electronic stabilization means Em contains a set of DC/DC converters R1 . . . RN and the control electronics is implemented by means of a Programmable System-on-Chip S. Each DC/DC converter R1 . . . RN is responsible for stabilizing the output voltage of a transducer module M1 . . . MN (each comprising one cell or a group of cells with similar thermal gradients). The System-on-Chip S is responsible for monitoring each transducer module M1 . . . MN, in this case through voltage measurements made on the DC/DC converters R1 . . . RN connected thereto, i.e. Vou1 to VoutN, and based on said measured voltages controls each DC/DC converter R1 . . . RN to obtain the same voltage at the output of each transducer-DC/DC converter assembly. By adding the individual powers delivered by the converters R1 . . . RN, the desired global output power is obtained.

The use of the described SoC based control solution solves the limitation that produces the reversibility of the cells, which could prevent that the associated assembly of transducer modules be efficient. This microelectronic technology based control increases the efficiency and accuracy of the system and allows the regulation of voltage and current at the output.

Figure 3:
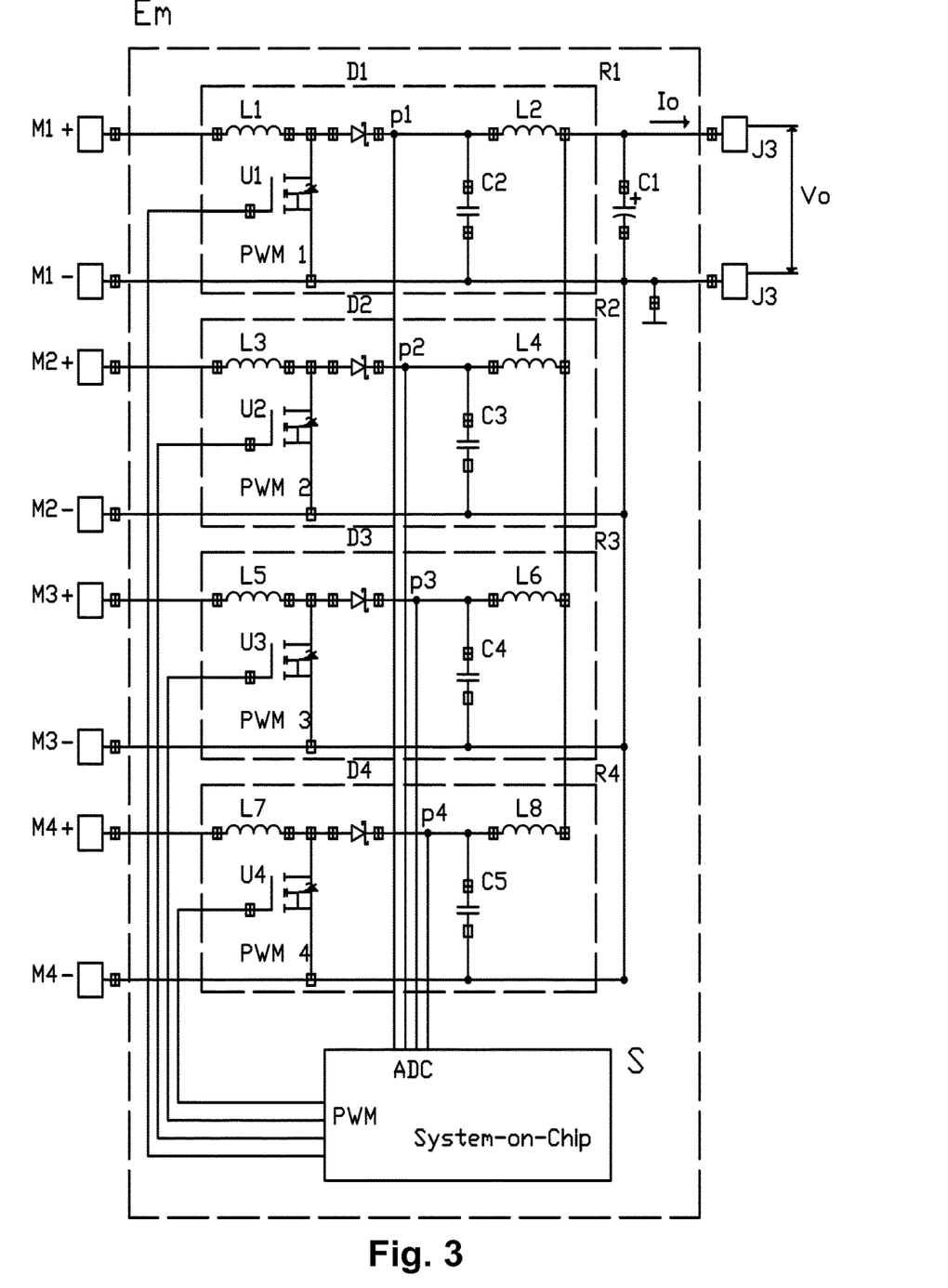
FIG. 3 shows the internal elements of the electronic stabilization means of the system of the present invention, for an embodiment, depicting an schematic of four DC/DC converters included therein together with a SoC PWM-controlling the DC/DC converters.

FIG. 3 shows the schematics of four DC-DC converters R1-R4, for an embodiment for which the system comprises four Peltier cell modules M1-M4 (each module may contain one or more Peltier cells working at the same rate), where each module uses an individual DC/DC converter R1-R4. In FIG. 3, the modules M1-M4 are 35 not depicted but only their output terminals M1+, M1– to M4+ and M4–, connected to the input terminals of the corresponding DC/DC converters R1-R4.

The system performance was tested by simulations and experimentally (see simulation results below). To verify operation simulations have been performed using different types of converters, particularly Boost, Flyback and coupled double Boost. Since the type of converter used is not essential for the proper functioning of the system of the 5 invention, for the product development a Boost converter has been chosen given it
simplicity, being the converter that is shown in FIG. 3

As mentioned above, in the embodiment of FIG. 3, each DC/DC converter R1-R4 is a Boost converter including an input inductor L1, L3, L5 and L7, a semiconductor switch U1-U4 (in this case formed by a MOSFET with a Zener diode protection), a diode D1-D4 and an output capacitor C2-C5. Moreover, each of the DC/DC converters R1-R4 comprises, at its output, a series output inductor L2, L4, L6, L8 each having an input terminal and an output terminal, where, as shown in the Figure, the output terminals of the series output inductors L2, L4, L6, L8 are electrically connected together, such that the currents circulating there through are added into global output current lo, and said output terminals are also connected to a first terminal of a common parallel output capacitor C1 at which terminals (J3) the global output voltage Vo is provided, where the values of the series output inductors L2, L4, L6, L8 and of the common parallel output capacitor C1 are selected to stabilize the global output voltage Vo at least minimizing the voltage ripple thereof.

As shown in FIG. 3, the SoC S receives voltage measurements made by respective voltage detectors p1-p4 at the output of diodes D1-D4, in the form of analogue signals which will be digitized by an ADC (Analogue to Digital Converter) block implemented in the SoC S. From the received voltage measurements, the SoC S generates individual PWM control signals, PWM1 to PWM 4 for the embodiment of FIG. 3, for the individual control of the converters R1-R4 to regulate their output voltages separately, such that a constant global output voltage Vo is obtained, making that the output voltages of all the converters C1-C4 be the same.

The series output inductors L2, L4, L6, L8 and parallel output capacitor C1 have two functions in the operation of the system. The first function is that of stabilizing and minimizing the voltage ripple at the output of the system, obtaining a stable voltage. The second function is that of allowing knowing which of the converters R1-R4 is providing an output voltage different to the one required at the system output.

Regarding said second function, by placing the voltage detectors p1-p4 at a point previous to the series output inductors L2, L4, L6, L8, the measured voltages include respective voltage ripples, said voltage ripples being representative of the contribution of each of the transducer modules M1-M4 to the global output power, and thus indicate if the output voltage of the respective converter is too high (high voltage ripple) or too low (low voltage ripple).

The embodiment of FIG. 3 is perfectly reproducible for a structure of N modules, where N>4.

Next, the basic operation of the system, for the embodiment of FIG. 3, is described.

At the output of the diodes D1-D4 of the converters C1-C4, voltage is measured automatically in real time. As mentioned above, in order to perform these measurements is essential the function of the inductor L2, L4, L6, L8, which allows having the same average voltage at the outputs of the DC/DC converters C1-C4 and at the output of the system, but with a different voltage ripple which will vary depending on the contribution of each module M1-M4 to the system. The use of low resistivity inductors increases the efficiency of the output stage.

The responsible for performing the voltage measurement is the System-on-Chip S, where both hardware and software for performing the measurement and control functions are implemented.

Using an ADC, voltages at the output of the respective diode D1-D4 of each converter C1-C4 are analysed by the SoC S.

A control program/algorithm implemented in the SoC S ensures accurate and unitary control of the voltage output of all modules M1-M4. The SoC S uses PWM control to act precisely on each MOSFET U1-U4.

Figure 4:
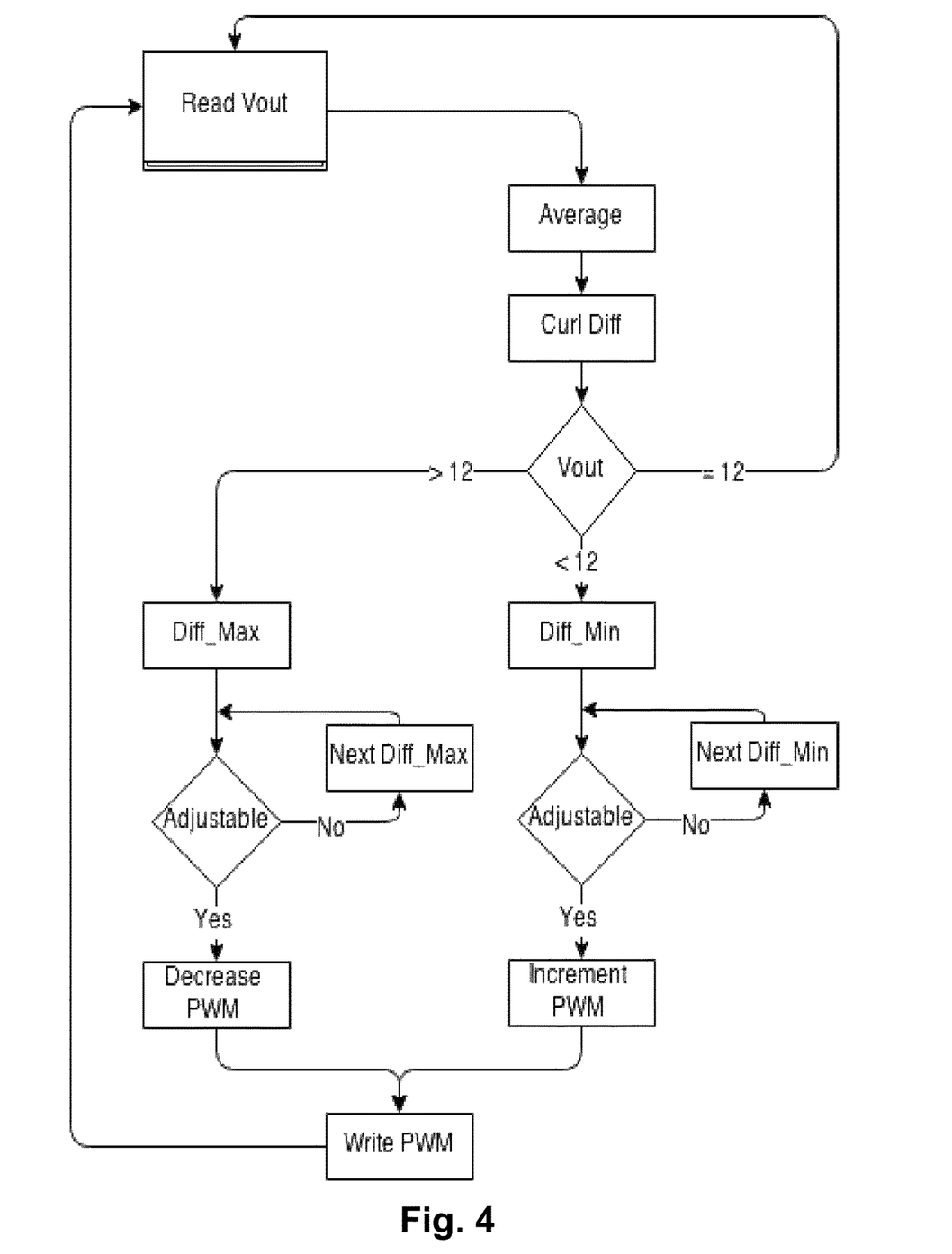
FIG. 4 is a flowchart of the control algorithm implemented by the system of the present invention, for an embodiment.

Control Algorithm:

FIG. 4 shows the operation diagram of the control algorithm implemented by the SoC, for an embodiment. According to the described operation of the DC/DC converters, the algorithm performs the following actions:

In stable operating conditions, the average output voltage of the diodes D1-D4 (and before the inductors L2, L4, L6, L8) tends to be very similar for all channels, i.e. for all modules M1-M4, and also for the system output. Here, the possible difference will be mainly due to small variations due to the inductor resistance (about milliohms) and to the current at the Boost converter output. This will cause a small ripple in the converter output signal.

Voltage ripple becomes higher when the power contributions of the channels (modules) differ: the higher the contribution of a channel to the system output power, the greater the ripple.

The function of the PWM control in the system is to control the contribution of each channel to the system. Thus, if any of the channels has a high voltage ripple and another has a low voltage ripple, increasing the PWM duty cycle of the low voltage ripple channel can increase the contribution thereof and decreasing the PWM duty cycle of the high voltage ripple channel reduces the contribution thereof, in order to maintain the desired average voltage.

The final result is to obtain a stabilization of the global output voltage from the individual contributions of each module M1-M4. The simulation and experimental results set forth below will show the proper functioning of the system of the present invention.

The above described actions of the control algorithm are, for an embodiment, specifically performed by the process steps of the flowchart of FIG. 4, which are next described:

Read Vout: The voltage measurements (Vout1-VoutN in FIG. 2), coming from the internal ADC, are read by the SoC, for then channels, i.e. for each module M1 . . . MN.

Average: An average of the voltage measurements for the n channels is performed, and expressed as average voltage Vout.

Curl diff: The voltage ripple of each voltage measurement signal is sought.—Rhombus decision Vout: The average of the voltage measurements Vout is compared with the required stabilized global output voltage Vo, in this case with a value of 12V, and:

If Vout=12V, no correction is needed, and the process returns to Read Vout to continue reading voltage measurements;

If Vout<12V:

Diff_Min: The channel with the minimum difference between the voltage ripple peaks or between the maximum or minimum voltage ripple peak and Vout is sought and selected;

checking if the selected channel n is adjustable, i.e. if the increasing of the duty cycle of the PWM applied to the associated DC/DC converter can make it increase its contribution to Vo while meeting safety requirements (not overheating, etc.), and:

if the selected channel is not adjustable: Next Diff_Min: select the next channel with the minimum difference;

if the selected channel is adjustable:

Increment PWM: Increment the duty cycle of the PWM of the selected channel, and

Write PWM: Write in memory the new increased PWM duty cycle, in order to apply it to the corresponding DC/DC converter, and the process returns to Read Vout to continue reading voltage measurements;

If Vout>12V:

Diff_Max: The channel with the maximum difference between the voltage ripple peaks or between the maximum or minimum voltage ripple peak and Vout is sought and selected;

checking if the selected channel n is adjustable, i.e. if the decreasing of the duty cycle of the PWM applied to the associated DC/DC converter can make it decrease its contribution to Vo while meeting safety requirements (not overheating, etc.), and:

if the selected channel is not adjustable: Next Diff_Max: select the next channel with the maximum difference;

if the selected channel is adjustable:
Decrease PWM: Decrease the duty cycle of the PWM of the selected channel, and
Write PWM: Write in memory the new decreased PWM duty cycle, in order to apply it to the corresponding DC/DC converter and the process returns to Read Vout to continue reading voltage measurements.

The PWM duty cycle is increase/decreased in discrete steps, particularly with an accuracy of 1/100 steps for the tested implementation, although as the number of discrete steps is internally generated with a counter, by increasing/decreasing the counter steps said accuracy is changed.

Figure 5:
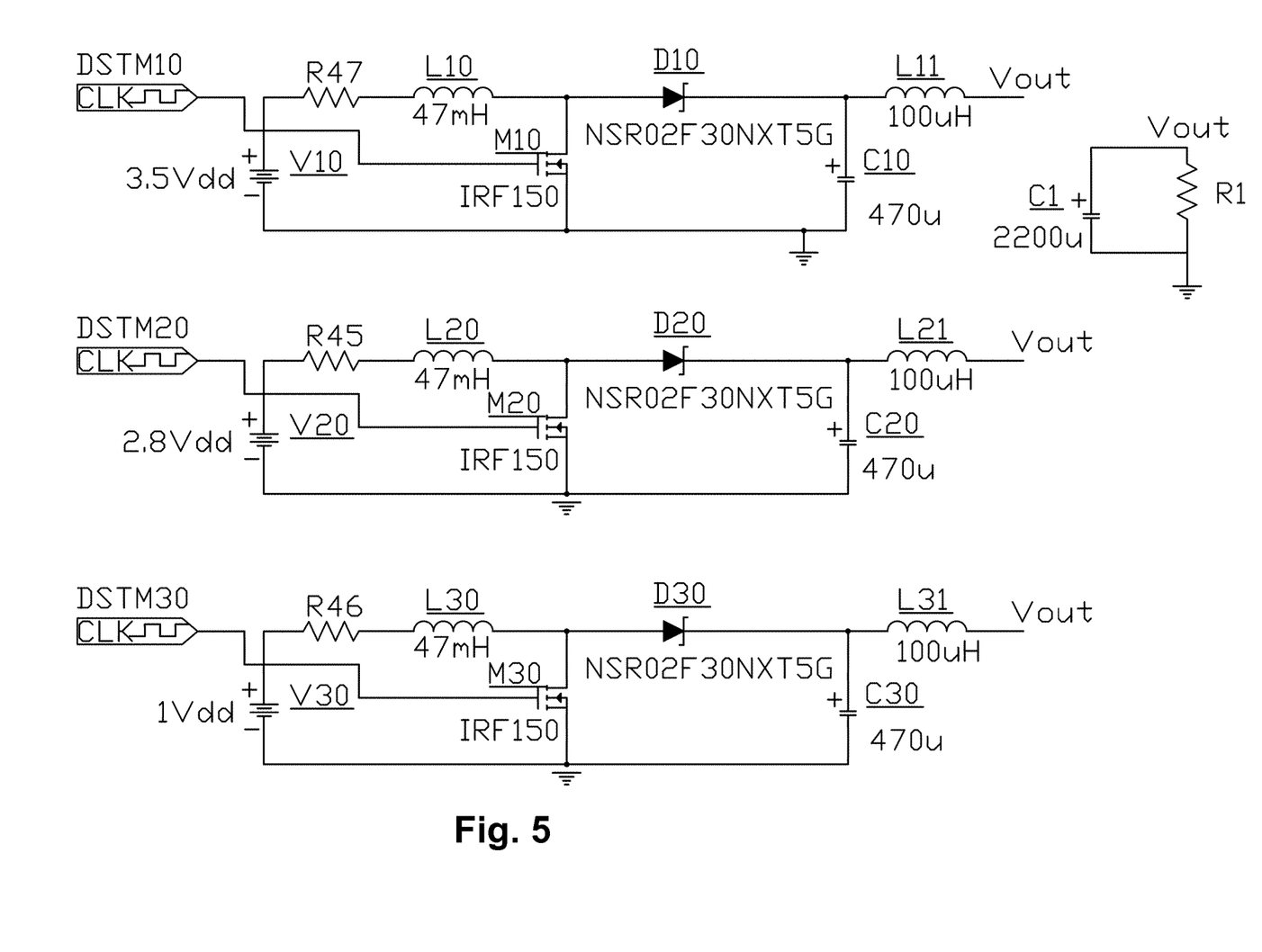
FIG. 5 is a circuit arrangement (corresponding to the circuit of FIG. 3) used to simulate the system of this invention.
Figure 6:
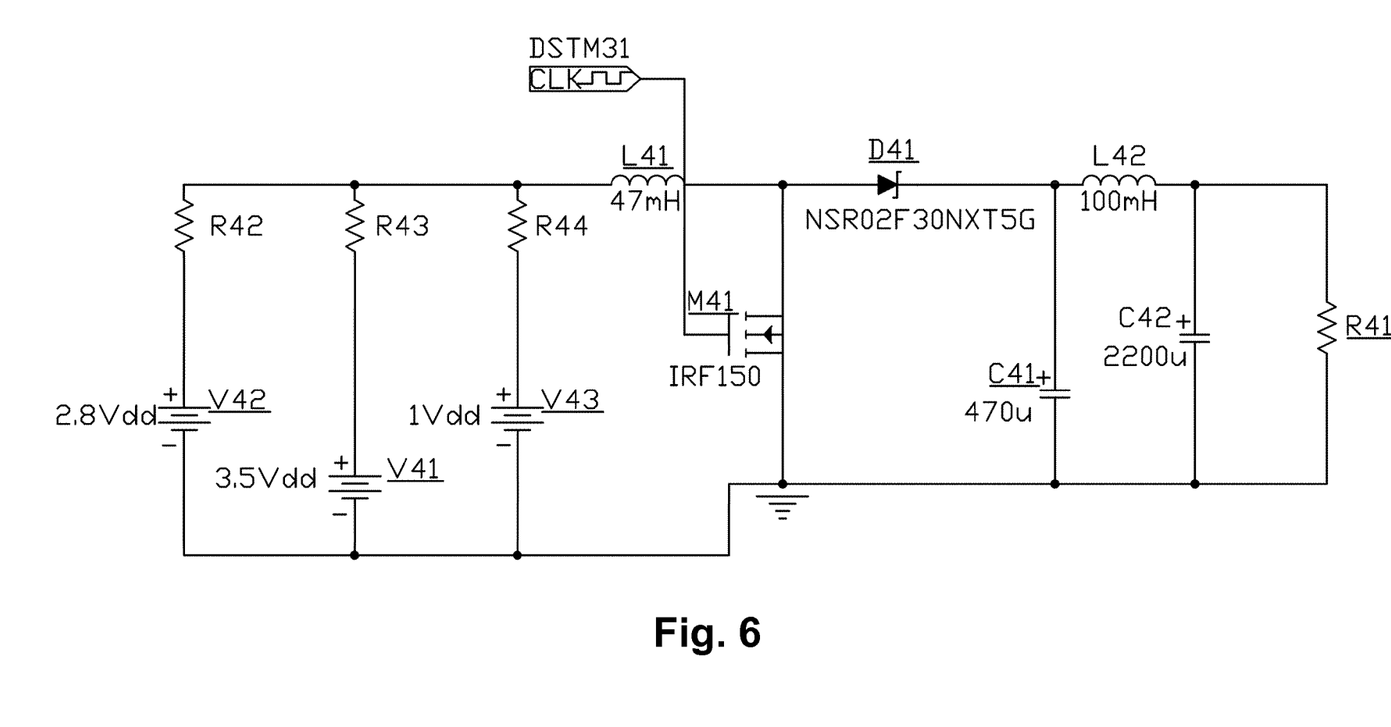
FIG. 6 shows a conventional arrangement, which is not part of the present invention, with a classical parallel association of the same voltage sources and resistances present in the arrangement of FIG. 5 for comparison.

The above mentioned simulations were performed for the system of the invention according to the arrangement of FIG. 5 (corresponding to the circuit of FIG. 3) and for the parallel conventional arrangement of FIG. 6, for comparison purposes. As will be set forth below, the result of the simulations (FIGS. 7 to 9) show the significant improvement achieved by the system of the present invention in the total power compared to a classical parallel arrangement scheme of the components, which is one of the possible architectures to connect the Peltier cells.

For both arrangement, of FIGS. 5 and 6, it has been assumed that the voltage sources in the simulation have different voltages in order to better model the behavior of the Peltier cells when subjected to different temperatures. An internal resistance of 2Ω to represent the internal resistance typical in these cells has been used for each voltage source, i.e. for R45, R46 and R47 in FIG. 5, and for R42, R43 and R44 in FIG. 6.

In FIG. 5 these voltage sources have been assumed to be V10=3.5 V, V20=2.8 V and V30=1 V, and the values or references for each of the components of the arrangement (L10, L20, L30, D10, D20, D30, L11, L21, L31, M10, M20, M30, C1) are those indicated in the figure. DSTM10, DSTM20 and DSTM30 represent the PWM control signals applied to the transistors M10, M20 and M30.

As stated above, FIG. 6 shows a parallel combination of cells for the simulation in which voltages sources of V43=1 V, V42=2.8 V and V41=3.5 V are also used. In the circuit of FIG. 6 these voltages have been increased to model 12 V output, with a load resistance of 50Ω (R41). The values or references for each of the components of the arrangement of FIG. 6 (L41, L42, D41, C41, C42, M41) are also those indicated in the figure. DSTM31 represents the PWM control signal applied to the transistor M41.

Figure 7:
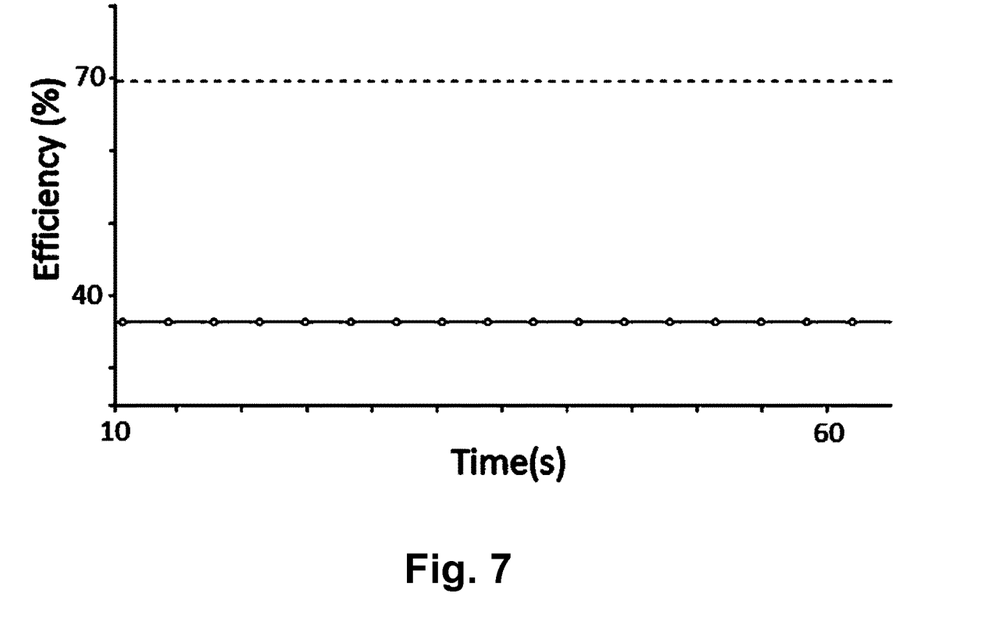
FIGS. 7 to 9 are graphs showing the result of several simulations in a coordinate system (time in the horizontal scale and magnitude in they-axis).

The graph of FIG. 7 shows the efficiency of the systems at their output. The efficiency of the arrangement of FIG. 5 is shown by dashed line and the efficiency of the arrangement of FIG. 6 is shown by means of a line with small circles. Both signals (dashed line and line with circles) show the output power of each system, divided by the sum of the powers that provide the voltage sources. An average has been done since by using a PWM the power delivered by the sources is not constant, depending on the moments the MOSFET is conducting.

As shown in the simulation the total power provided by the system according to this invention produces a significant improvement, from 36% to 70% (or higher if resistances R45, R46 and R47 had a lower power consumption), in the overall performance of the system. This is so because the voltage sources that make up the system of this invention, particularly that of FIG. 5 used for the simulations, unlike the parallel arrangement of FIG. 6, do not interfere with the sum of power of each of the cells with the others, each cell providing its own power.

Figure 8:
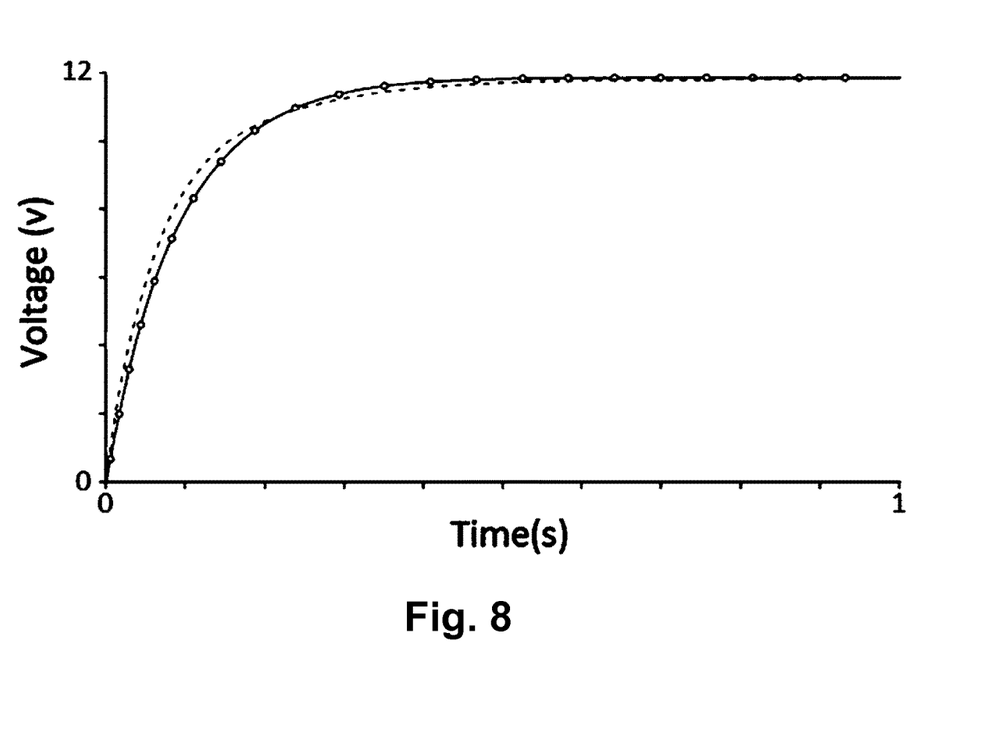

The graph of FIG. 8 corresponds to the output of the two systems under comparison. A line with circles illustrating the voltage at resistor R41 of FIG. 6, and a dashed line indicating the voltages at C10, C20, C30, R1 (Vout), in the circuit of FIG. 5. It can be seen the quick stabilization by PWM to 12V.

Figure 9:
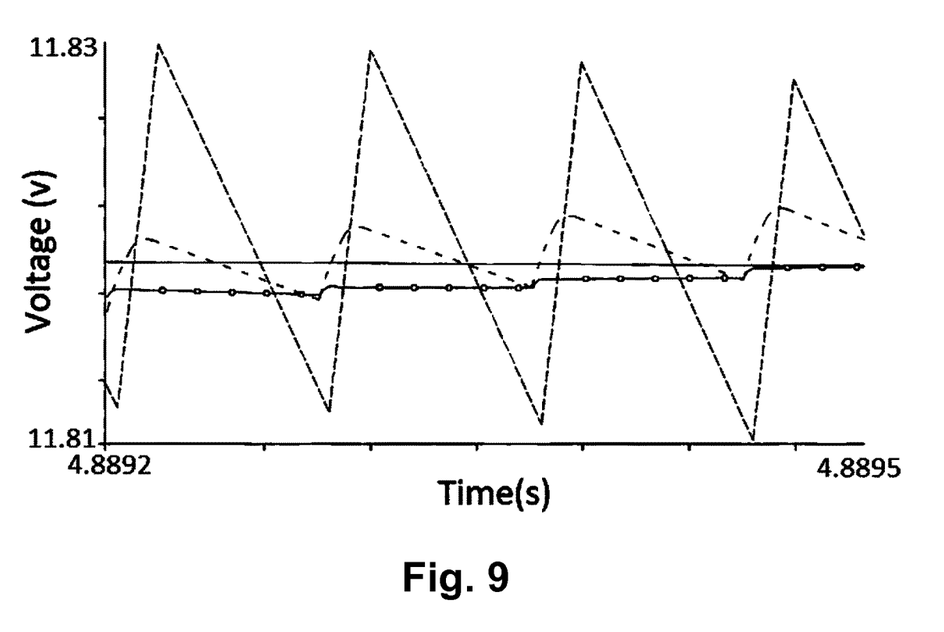

A zoom of a portion of the dashed line of FIG. 8, at the right end thereof (when the system stabilizes), is shown in FIG. 9.

FIG. 9 shows how the voltages oscillate at the outputs of the diodes of FIG. 5. The continuous signal, parallel to the x-axis is the system output, i.e. Vout, which is seen to be almost stable; the line with small squares represents the output of the diode of the channel with a 1 V input, i.e. D30, the ripple showing that is the one which contributes less to the system. The dashed line corresponds to the contribution of the 2.8 V channel, i.e. the voltage at the output of diode D20. And finally the saw tooth signal corresponds to the channel with a voltage of 3.5V, i.e. the voltage at the output of diode D10, which is seen to be the one that contributes most to system because the ripple is greater than that of the other channels A person skilled in the art could introduce changes and modifications in the embodiments described without departing from the scope of the invention as it is defined in the attached claims.

The invention claimed is:

1. A thermoelectric power generating system, comprising:
a power generator arrangement comprising power generator units electrically connected to each other to provide a global output voltage, each power generator unit including at least one thermoelectric device and being capable of generating an individual output voltage; and
an electronic stabilization system comprising:
a plurality of DC/DC converters, each with an input connected to the individual output voltage of at least one of the power generator units;
a plurality of electrical variable detectors including at least one of voltage detectors and current detectors, each made and arranged for automatically measuring the individual voltage or individual current existing at a point of at least one of the plurality of the DC/DC converters that is connected to at least one of the power generator units; and
a microprocessor-based controller connected to the electrical variable detectors to receive the measured electrical variables, whether they are voltages or currents, and that is configured for automatically controlling the operation of the plurality of DC/DC converters, based on at least one desired DC/DC converter output voltages and desired DC/DC converter output currents,
wherein:
the microprocessor-based controller implements at least one control algorithm for real time analysis of the values of the at least one of the received measured voltages and the received measured currents, and for automatically controlling the operation of the plurality of DC/DC converters, based on the results of the real time analysis, with the goal of equalizing the output voltages of all of the plurality of the DC/DC converters, the desired DC/DC converter output voltages being equal voltages;
each of the plurality of DC/DC converters comprises, at its output, plurality of output inductors, each having an input terminal and an output terminal, where the output terminals of the plurality of output inductors are electrically connected together such that currents circulating there through are added, and are also electrically connected to a first terminal of a common parallel output capacitor at which terminals the global output voltage is provided, where the values of the plurality of output inductors and of the common parallel output capacitor are selected to stabilize the global output voltage at least minimizing the voltage ripple thereof;

each of the plurality of voltage detectors is connected to the first terminal of a respective member of the plurality of output inductors, for measuring the voltage existing at the first terminal including the voltage ripple contained therein; and the control algorithm is configured to automatically control the operation of the plurality of DC/DC converters based on the measured voltage ripples to adjust the global output voltage to a required value by equalizing the contribution of the plurality of DC/DC converters to the global output voltage, increasing the contribution one or more of the plurality of DC/DC converters with a lower voltage ripple and/or decreasing the contribution of one or more of the plurality of DC/DC converters with a higher voltage ripple.

2. The thermoelectric power generating system of claim 1, wherein the microprocessor-based controller is implemented in a System-on-Chip.

3. The thermoelectric power generating system of claim 1, wherein the plurality of DC/DC converters are modulation controlled converters, the microprocessor-based controller being configured for controlling operation of the plurality of DC/DC converters by controlling the modulation thereof.

4. The thermoelectric power generating system of claim 3, wherein the modulation of the plurality of DC/DC converters is a PWM modulation.

5. The thermoelectric power generating system of claim 1, wherein each of the at least one of voltage detectors and current detectors is connected to a middle or intermediate point of one of the plurality of DC/DC converters for measuring the voltage existing at the middle or intermediate point or the current circulating there through, and further wherein each of the plurality of DC/DC converters comprises at least one electric or electronic component arranged and electrically connected between the middle or intermediate point and the output of the corresponding DC/DC converter.

6. The thermoelectric power generating system of claim 1, wherein the control algorithm performs the increasing/decreasing of the contribution of one or more of the plurality of DC/DC converters to the global output voltage by generating respective individual duty cycle PWM values for the PWM-modulation control of the plurality of DC/DC converters.

7. The thermoelectric power generating system of claim 1, wherein the power generator units are grouped in groups according to different thermal gradient ranges under which the power generator units are submitted, and further wherein the input or inputs of each DC/DC converter is/are connected to the outputs of one of the groups of power generator units.

8. The thermoelectric power generating system of claim 1, wherein the at least one thermoelectric device of the power generator units comprises one or more Peltier cells.

9. The thermoelectric power generating system of claim 8, wherein one or more of the Peltier cells is/are configured and arranged in the power generator arrangement such that when submitted to thermal gradients differing from each other above a determined threshold, some of them tend to generate undesired individual output voltages which can reverse the operation mode of some others of the Peltier cells, thus making the latter work to electro-thermally generate thermal energy, and further wherein the electronic stabilization system is adapted to avoid the reversal of the operation mode of the Peltier cells, for which purpose the microprocessor-based controller is configured for automatically controlling the operation of the plurality of DC/DC converters to obtain desired individual output voltages having a value higher than the undesired individual output voltages.

10. The thermoelectric power generating system of claim 1, wherein the thermoelectric devices of the power generator units comprise one or more solar cells.

* * * * *